(12) United States Patent
Venkataraman et al.

(10) Patent No.: US 12,713,850 B2
(45) Date of Patent: Aug. 18, 2026

(54) CARBON REPLENISHMENT OF SILICON-CONTAINING MATERIAL

(71) Applicant: Applied Materials, Inc., Santa Clara, CA (US)

(72) Inventors: Shankar Venkataraman, San Jose, CA (US); Zeqing Shen, San Jose, CA (US); Susmit Singha Roy, Campbell, CA (US); Abhijit Basu Mallick, Fremont, CA (US); Lakmal C. Kalutarage, San Jose, CA (US); Jongbeom Seo, San Jose, CA (US); Sai Hooi Yeong, Cupertino, CA (US); Benjamin Colombeau, San Jose, CA (US); Balasubramanian Pranatharthiharan, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 646 days.

(21) Appl. No.: 17/960,569

(22) Filed: Oct. 5, 2022

(65) Prior Publication Data

US 2024/0120193 A1 Apr. 11, 2024

(51) Int. Cl.
*H10P 14/692* (2026.01)
*H10D 30/01* (2025.01)
(Continued)

(52) U.S. Cl.
CPC ....... *H10P 14/6922* (2026.01); *H10D 30/014* (2025.01); *H10D 64/015* (2025.01);
(Continued)

(58) Field of Classification Search
None
See application file for complete search history.

(56) References Cited

U.S. PATENT DOCUMENTS

2004/0072436 A1* 4/2004 RamachandraRao ........................ H01L 21/76808 438/692
2008/0076262 A1 3/2008 Kevwitch et al.
(Continued)

FOREIGN PATENT DOCUMENTS

KR 20160093689 A 8/2016
KR 20200001545 A 1/2020
(Continued)

OTHER PUBLICATIONS

Search Report for Taiwan Invention Patent Application No. 112137874 dated Jul. 3, 2024, 10 pages.
(Continued)

*Primary Examiner* — Xiaoming Liu
(74) *Attorney, Agent, or Firm* — Kilpatrick Townsend & Stockton LLP

(57) ABSTRACT

Exemplary methods of semiconductor processing may include etching a portion of a silicon-containing material from a substrate disposed within a processing region of a semiconductor processing chamber. The silicon-containing material may extend into one or more recesses defined by alternating layers of material deposited on the substrate. The methods may include providing a carbon-containing precursor to the processing region of the semiconductor processing chamber. The methods may include contacting a remaining silicon-containing material with the carbon-containing precursor. The contacting with the carbon-containing precursor may replenish carbon in the silicon-containing material. The methods may include providing a cleaning agent to the processing region of the semiconductor processing chamber. The methods may include contacting the substrate with the cleaning agent. The contacting with the cleaning precursor may remove surface oxide from the substrate.

20 Claims, 4 Drawing Sheets

(51) Int. Cl.

| | |
|---|---|
| ***H10D 64/01*** | (2025.01) |
| ***H10P 14/60*** | (2026.01) |
| ***H10P 50/28*** | (2026.01) |
| ***H10P 70/00*** | (2026.01) |
| *H10D 30/67* | (2025.01) |

(52) U.S. Cl.

CPC ......... *H10D 64/017* (2025.01); *H10D 64/018* (2025.01); *H10P 14/6336* (2026.01); *H10P 14/6682* (2026.01); *H10P 14/6689* (2026.01); *H10P 50/283* (2026.01); *H10P 70/23* (2026.01); *H10D 30/6735* (2025.01)

(56) References Cited

U.S. PATENT DOCUMENTS

| | | | | |
|---|---|---|---|---|
| 2008/0199977 | A1 | 8/2008 | Weigel et al. | |
| 2015/0162189 | A1* | 6/2015 | Xie | H01L 21/02118 438/780 |
| 2019/0019681 | A1 | 1/2019 | Wong et al. | |
| 2020/0006126 | A1* | 1/2020 | Liou | H01L 21/76825 |
| 2022/0052181 | A1* | 2/2022 | Lin | H10D 30/43 |

FOREIGN PATENT DOCUMENTS

| | | | |
|---|---|---|---|
| KR | 20220021404 | A | 2/2022 |
| TW | 200845212 | A | 11/2008 |
| TW | 202207368 | A | 2/2022 |

OTHER PUBLICATIONS

Application No. PCT/US2023/075315 , International Search Report and Written Opinion, Mailed on Jan. 18, 2024, 9 pages.

Korean Application No. 10-2025-7014314, Office Action mailed on Dec. 19, 2025, 31 pages (17 pages of English Translation and 14 pages of original document).

* cited by examiner

CARBON REPLENISHMENT OF SILICON-CONTAINING MATERIAL

TECHNICAL FIELD

The present technology relates to methods and systems for semiconductor processing. More specifically, the present technology relates to systems and methods for replenishing carbon in silicon-containing materials after etching operations.

BACKGROUND

Integrated circuits are made possible by processes which produce intricately patterned material layers on substrate surfaces. Producing patterned material on a substrate requires controlled methods for forming and removing material. As device sizes continue to reduce, film characteristics may lead to larger impacts on device performance. Materials used to form layers of materials may affect operational characteristics of the devices produced. As material thicknesses continue to reduce, as-deposited characteristics of the films may have a greater impact on device performance.

Thus, there is a need for improved systems and methods that can be used to produce high quality devices and structures. These and other needs are addressed by the present technology.

SUMMARY

Exemplary methods of semiconductor processing may include etching a portion of a silicon-containing material from a substrate disposed within a processing region of a semiconductor processing chamber. The silicon-containing material may extend into one or more recesses defined by alternating layers of material deposited on the substrate. The methods may include providing a carbon-containing precursor to the processing region of the semiconductor processing chamber. The methods may include contacting a remaining silicon-containing material with the carbon-containing precursor. The contacting with the carbon-containing precursor may replenish carbon in the silicon-containing material. The methods may include providing a cleaning agent to the processing region of the semiconductor processing chamber. The methods may include contacting the substrate with the cleaning agent. The contacting with the cleaning precursor may remove surface oxide from the substrate.

In some embodiments, the silicon-containing material may be a silicon-and-oxygen-containing material. The silicon-containing material may be a silicon-oxygen-and-carbon-containing material. The methods may include generating a plasma of the carbon-containing precursor. The contacting of the remaining silicon-containing material with the carbon-containing precursor may include contacting the remaining silicon-containing material with plasma effluents of the carbon-containing precursor. A plasma power may be less than or about 3000 W. The carbon-containing precursor may be or include hexamethyldisilazane (HMDS), tetramethyldisilazane (TMDS), trimethylchlorosilane (TMCS), dimethyldichlorosilane (DMDCS), methyltrichlorosilane (MTCS), trimethylmethoxysilane (TMMS)($CH_3$—O—Si—$(CH_3)_3$), dimethyldimethoxysilane (DMDMS)($(CH_3)_2$—Si—$(OCH_3)_2$), methyltrimethoxysilane (MTMS)($(CH_3$—$O)_3$—Si—$CH_3$), phenyltrimethoxysilane (PTMOS)($C_6H_5$—Si—$(OCH_3)_3$), phenyldimethylchlorosilane (PDMCS) ($C_6H_5$—Si(Cl)—$(CH_3)_2$), dimethylaminotrimethylsilane (DMATMS)($(CH_3)_2$—N—Si—$(CH_3)_3$), or bis(dimethylamino)dimethylsilane (BDMADMS). The methods may include exposing the substrate to ultraviolet (UV) radiation prior to providing the cleaning agent to the processing region of the semiconductor processing chamber. Contacting the remaining silicon-containing material with the carbon-containing precursor and exposing the substrate to ultraviolet (UV) radiation may be performed simultaneously. A UV irradiance power may be characterized by between about 100 W/m 2 and about 2000 W/m 2. A UV wavelength may be characterized by between about 100 nm and about 400 nm. A temperature in the semiconductor processing chamber may be less than or about 500° C.

Some embodiments of the present technology encompass semiconductor processing methods. The methods may include providing a carbon-containing precursor to a processing region of a semiconductor processing chamber. A substrate may be disposed within the processing region. A silicon-containing material may extend into one or more recesses defined by alternating layers of material deposited on the substrate. An exposed surface of the silicon-containing material may be characterized by a first carbon concentration. The methods may include contacting the silicon-containing material with the carbon-containing precursor. The contacting may increase the first carbon concentration to a second carbon concentration. The methods may include providing a cleaning agent to the processing region of the semiconductor processing chamber. The methods may include contacting the substrate with the cleaning agent. The cleaning agent may remove surface oxide from the substrate.

In some embodiments, the methods may include providing one or more etchant precursors to the processing region of the semiconductor processing chamber, contacting the substrate with the one or more etchant precursors, and etching a portion of the silicon-containing material from the substrate. The cleaning agent may be or include dilute hydrofluoric acid. The second carbon concentration may be greater than or about 5 at. % higher than the first carbon concentration. The silicon-containing material may be an inner spacer of a gate all around structure. The methods may include exposing the substrate to ultraviolet (UV) radiation.

Some embodiments of the present technology encompass semiconductor processing methods. The methods may include providing a carbon-containing precursor to a processing region of a semiconductor processing chamber. A substrate may be disposed within the processing region. A silicon-containing material may extend into one or more recesses defined by alternating layers of material deposited on the substrate. An exposed surface of the silicon-containing material may be characterized by a first carbon concentration. The methods may include contacting the silicon-containing material with the carbon-containing precursor. The contacting may increase the first carbon concentration to a second carbon concentration. The methods may include exposing the substrate to ultraviolet (UV) radiation. The methods may include providing a cleaning agent to the processing region of the semiconductor processing chamber. The methods may include contacting the substrate with the cleaning agent. The cleaning agent may remove surface oxide from the substrate.

In some embodiments, contacting the silicon-containing material with the carbon-containing precursor and exposing the substrate to ultraviolet (UV) radiation may be performed simultaneously. The second carbon concentration may be greater than or about 20 at. %. A temperature in the semiconductor processing chamber may be greater than or about 200° C.

Such technology may provide numerous benefits over conventional systems and techniques. For example, embodiments of the present technology may increase carbon concentrations in materials that have been carbon depleted. Additionally, the present technology may increase resistance to subsequent etching operations. The increased resistance may allow subsequent etching operations to be performed to structures with reduced or eliminated removal of the materials treated increased carbon concentrations. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
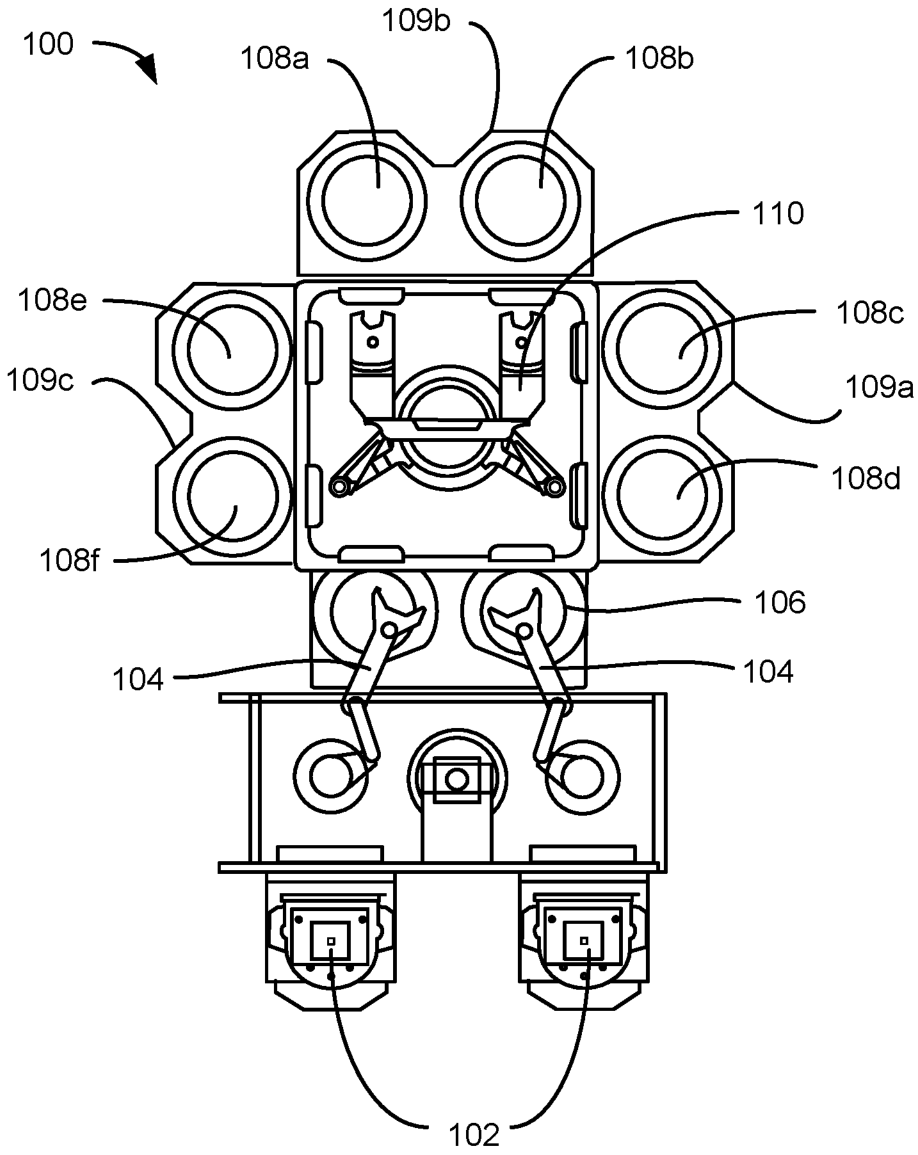
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

As semiconductor device sizes continue to reduce, the constituent films included within a structure may affect device performance, as well as fabrication of other materials being included in the device. Additionally, as demand increases, throughput and queue times become a point of emphasis. Thus, a demand exists for high-quality materials and structures that may be formed both quickly and efficiently. However, in processes to form conformal low dielectric constant silicon-containing materials, such as in gate all around (GAA) applications, high conformality and low dielectric constant may result in poor resistance during subsequent etching operations. Due to the depletion of carbon in the silicon-containing materials during trimming and other removal operations, the silicon-containing material may be completely removed during etching operations, such as cleaning operations using wet etchants.

To further increase conformality and decrease dielectric constant, conventional technologies may change deposition precursors and may deposit alternative materials, such as silicon-oxygen-and-carbon-containing materials. Although these techniques may be effective in depositing high quality materials, the materials may be prone to complete removal during subsequent operations due to poor resistance to some etchant materials.

The present technology overcomes these issues by intermittently treating the silicon-containing material having high conformality and low dielectric constant. After some dry etching operations, such as spacer trimming or dummy gate removal in GAA processing, the remaining silicon-containing material may be treated with a carbon-containing precursor and/or ultraviolet (UV) radiation. These treatments may return depleted carbon to the silicon-containing material, increasing the materials resistance to subsequent wet etching operations.

Although the remaining disclosure will routinely identify specific processes utilizing the disclosed technology, it will be readily understood that the systems and methods are equally applicable to other deposition and etching processes as may occur in the described chambers or any other chamber. Accordingly, the technology should not be considered to be so limited as for use with these specific deposition processes or chambers alone. The disclosure will discuss one set of possible chambers that may be used to perform processes according to embodiments of the present technology before additional variations and adjustments to this system according to embodiments of the present technology are described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108*a-f*, positioned in tandem sections 109*a-c*. A second robotic arm 110 may be used to transport the substrate wafers from the holding area 106 to the substrate processing chambers 108*a-f* and back. Each substrate processing chamber 108*a-f*, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108*a-f* may include one or more system components for depositing, annealing, curing and/or etching a dielectric or other film on the substrate. In one configuration, two pairs of the processing chambers, e.g., 108*c-d* and 108*e-f*, may be used to deposit dielectric material on the substrate, and the third pair of processing chambers, e.g., 108*a-b*, may be used to etch the deposited dielectric. In another configuration, all three pairs of chambers, e.g., 108*a-f*, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
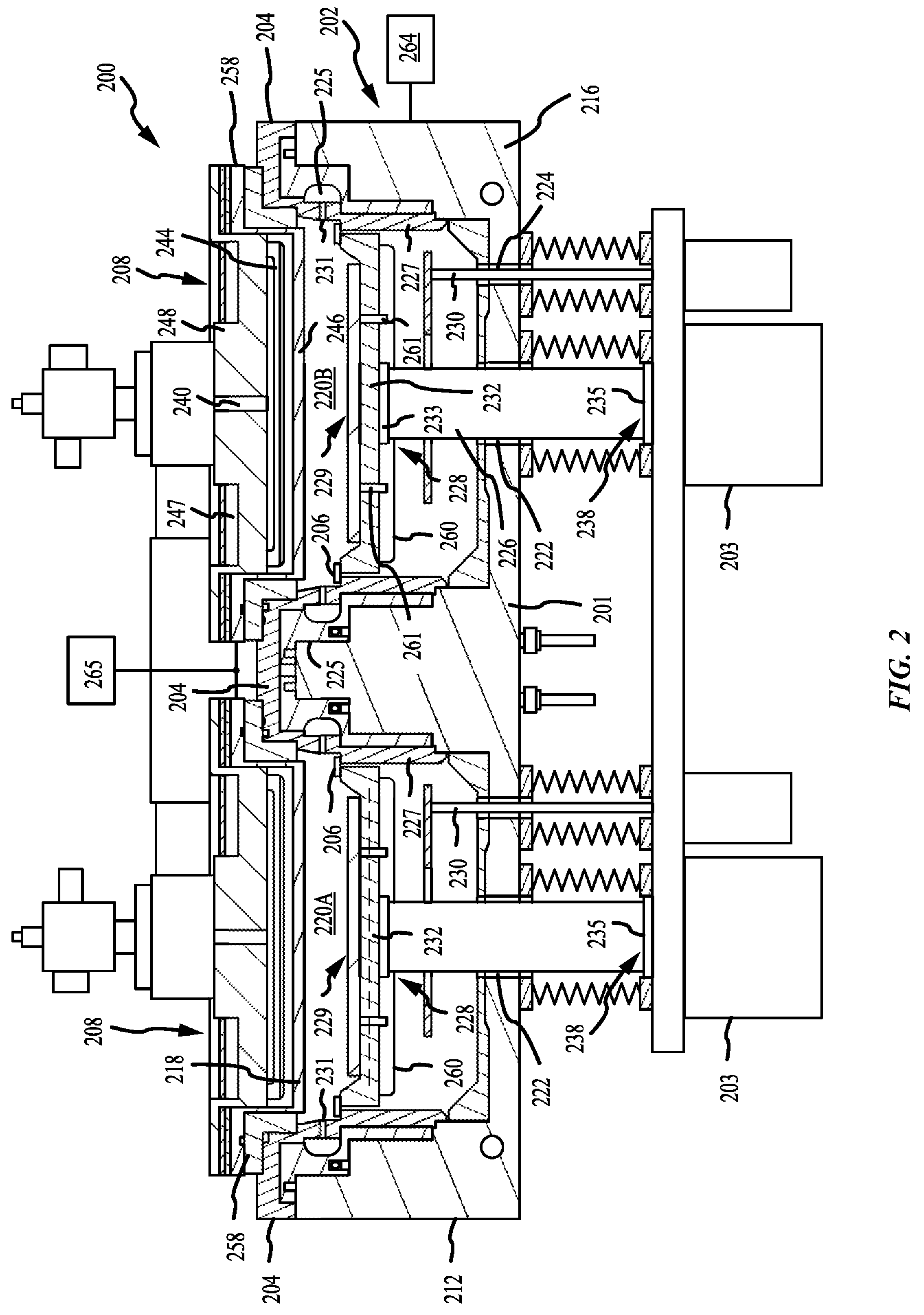
FIG. 2 shows a schematic cross-sectional view of an exemplary plasma deposition system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include faceplates or other components or assemblies according to embodiments of the present technology. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a gas delivery assembly 218 into the processing region 220B. The gas delivery assembly 218 may include a gasbox 248 having a blocker plate 244 disposed intermediate to a faceplate 246. A radio frequency ("RF") source 265 may be coupled with the gas delivery assembly 218, which may power the gas delivery assembly 218 to facilitate generating a plasma region between the faceplate 246 of the gas delivery assembly 218 and the pedestal 228, which may be the processing region of the chamber. In some embodiments, the RF source may be coupled with other portions of the chamber body 202, such as the pedestal 228, to facilitate plasma generation. A dielectric isolator 258 may be disposed between the lid 204 and the gas delivery assembly 218 to prevent conducting RF power to the lid 204. A shadow ring 206 may be disposed on the periphery of the pedestal 228 that engages the pedestal 228.

An optional cooling channel 247 may be formed in the gasbox 248 of the gas distribution system 208 to cool the gasbox 248 during operation. A heat transfer fluid, such as water, ethylene glycol, a gas, or the like, may be circulated through the cooling channel 247 such that the gasbox 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
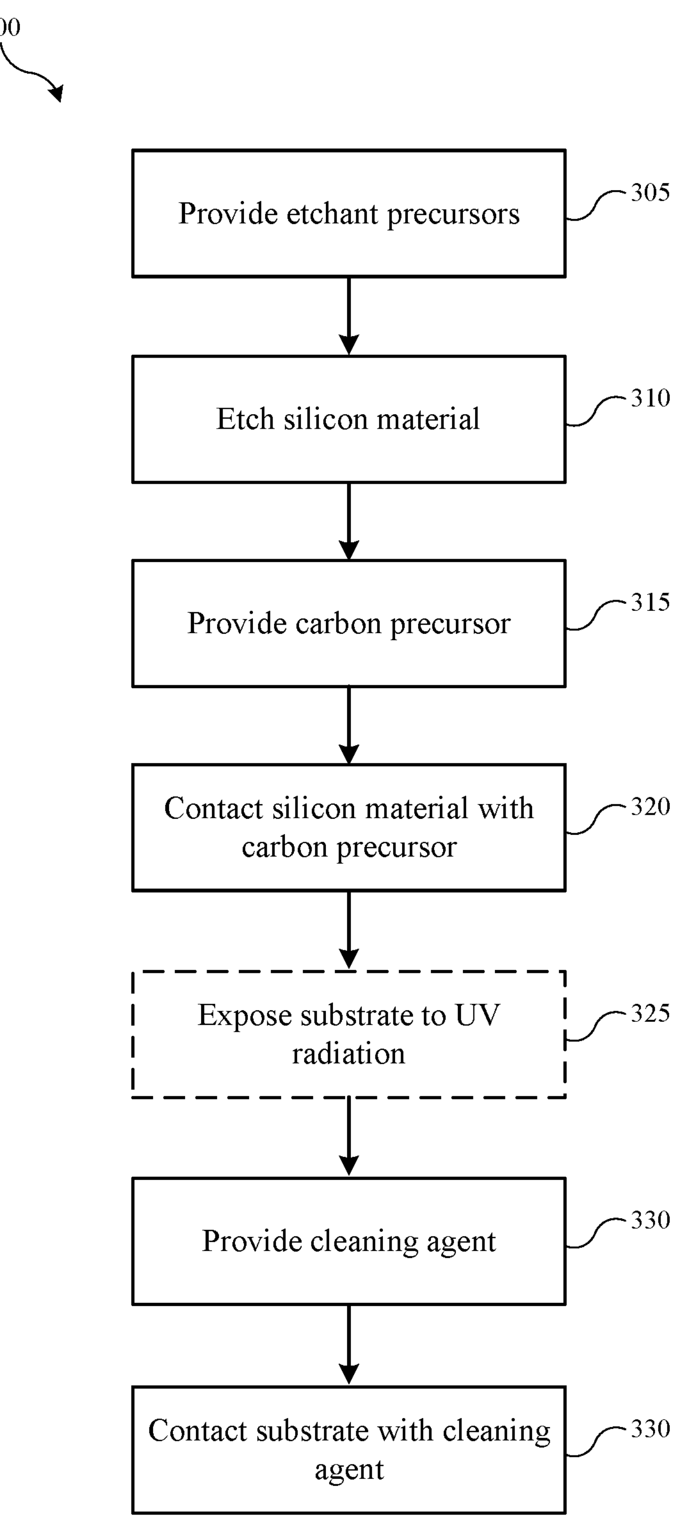
FIG. 3 shows operations in a semiconductor processing method according to some embodiments of the present technology.

FIG. 3 shows exemplary operations in a semiconductor processing method 300 according to some embodiments of the present technology. The method may be performed in a variety of processing chambers, including system 200 described above. Method 300 may include one or more operations prior to the initiation of the stated method operations, including front end processing, deposition, etching, polishing, cleaning, or any other operations that may be performed prior to the described operations. The method may include a number of optional operations as denoted in the figure, which may or may not specifically be associated with the method according to the present technology. For example, many of the operations are described in order to provide a broader scope of the semiconductor process, but are not critical to the technology, or may be performed by alternative methodology as will be discussed further below.

Method 300 may involve optional operations to develop the semiconductor structure to a particular fabrication operation. Although in some embodiments method 300 may be performed on a base structure, in some embodiments the method may be performed subsequent other material formation or removal. For example, any number of deposition, masking, or removal operations may be performed to produce any transistor, memory, or other structural aspects on a substrate. The substrate may be disposed on a substrate support, which may be positioned within a processing region of a semiconductor processing chamber. The operations may be performed in the same chamber in which aspects of method 300 may be performed, and one or more operations may also be performed in one or more chambers on a similar platform as a chamber in which operations of method 300 may be performed, or on other platforms. Method 300 describes the operations shown schematically in FIGS. 4A-4B, the illustrations of which will be described in conjunction with the operations of method 300. It is to be understood that FIGS. 4A-4B illustrate only partial schematic views, and a substrate may contain any number of transistor sections having aspects as illustrated in the figures.

Figure 4A:
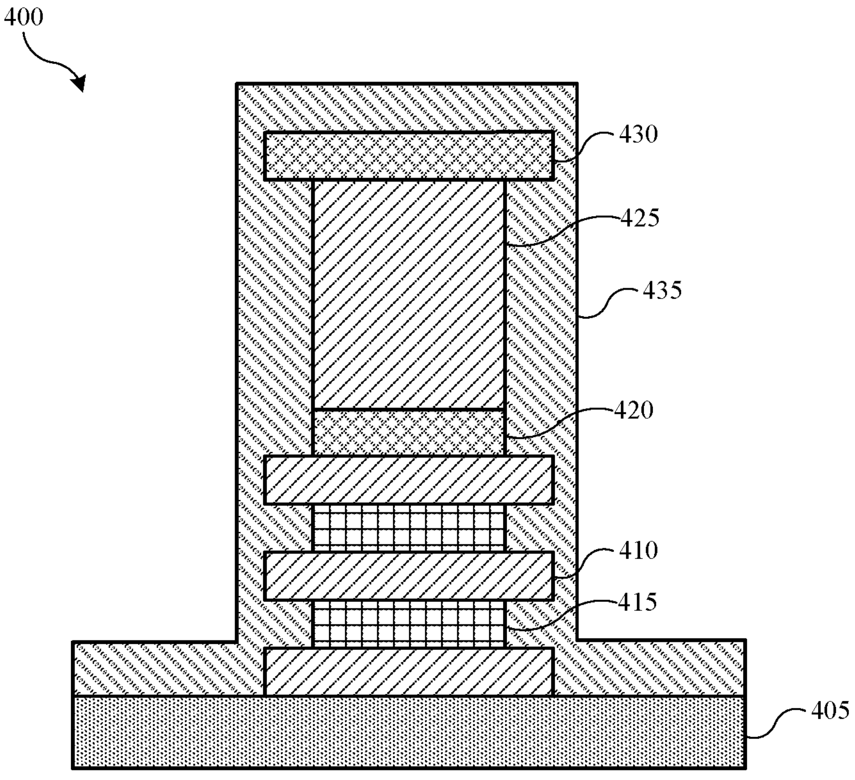
FIGS. 4A-4B show cross-sectional views of substrates being processed according to some embodiments of the present technology.
Figure 4B:
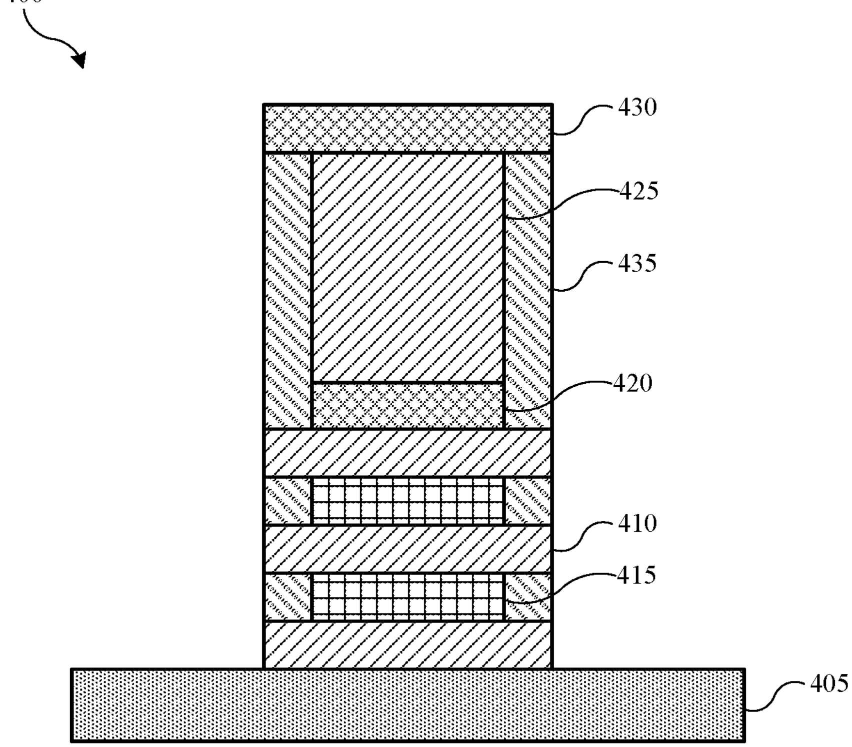

As shown in FIG. 4A, structure 400 may include a substrate 405. The substrate 405 may be made of or contain silicon or some other semiconductor substrate material. One or more layers of material may be formed over the substrate 405. For example, alternating layers of material may be deposited on the substrate 405. The alternating layers of material may include, for example, layers of silicon 410 and layers of silicon germanium 415. The layers of silicon germanium 415 may be etched selectively to the layers of silicon 410 in previous operations to form one or more recesses defined by alternating layers of material. A dummy gate 425, which may be replaced with a metal in subsequent operations, may be deposited over the alternating layers of silicon 410 and layers of silicon germanium 415. The dummy gate 425 may be a silicon material and may be separated from the alternating layers of material by a layer of silicon oxide 420. Similarly, a layer of silicon oxide 430 may be formed over the dummy gate 425. A spacer 435 may be formed on the substrate 405 overlying the materials previously described. The spacer 435 may extend into the one or more recesses defined by alternating layers of material deposited on the substrate 405.

The spacer 435 may be a silicon-containing material, such as low dielectric constant material. For example, the spacer 435 may be a silicon-and-oxygen-containing material or a silicon-oxygen-and-carbon-containing material. These silicon-containing conformal materials, such as silicon-and-oxygen-containing material or silicon-oxygen-and-carbon-containing material, exhibit lower dielectric constants than other conformal materials, which makes these silicon-containing materials useful in gate all around (GAA) applications. The silicon-containing material of the spacer 435 may have a dielectric constant of less than or about e a dielectric constant of less than or about 5.0. Additionally, the silicon-containing material of the spacer 435 may have a conformality of greater than or about 90%. However, as discussed below, subsequent GAA processing may utilize wet etchants, and these silicon-containing materials may have poor resistance to these wet etchants or cleaning agents. The poor resistance has challenged the use of these low dielectric constant conformal materials.

At optional operation 305, method 300 may include providing one or more etchant precursors to the processing region of the semiconductor processing chamber. The etchant precursors may include, for example, a hydrogen-containing precursor, a nitrogen-containing precursor, an oxygen-containing precursor, or any other conventional semiconductor precursors used to remove silicon-containing material. In one example, the one or more etchant precursors may include diatomic hydrogen and diatomic nitrogen. In another example, one or more etchant precursors may include diatomic hydrogen and molecular oxygen. In embodiments, method 300 may include forming a plasma of the one or more etchant precursors to increase bombardment and removal of the silicon-containing material of the spacer 435.

At operation 310, method 300 may include contacting the substrate 405 with the one or more etchant precursors. Method 300 may include etching a portion of the silicon-containing material, referred to as the spacer 435, from the substrate 405. As shown in FIG. 4B, the one or more etchant precursors may contact the substrate 405 and remove a portion of the spacer 435, or silicon-containing material, from the substrate 405. The etching may leave a portion of the silicon-containing material of spacer 435, such as the portion extending into the one or more recesses defined by alternating layers of material. Specifically, the remaining silicon-containing material of the spacer 435 may be the material in recesses formed in the layers of silicon germanium 415. In embodiments, operation 310 may be an inner spacer trim operation in GAA processing. In other embodiments, method 300 may include etching the dummy gate 425 such that the dummy gate 425 may be replaced with a metal material.

While etching the silicon-containing material of the spacer 435 or removing the dummy gate 425, carbon may be depleted from the spacer 435. Prior to operation 310, an exposed surface of the silicon-containing material of the spacer 435 may be characterized by a carbon concentration of greater than or about 15 at. %, such as greater than or about 16 at. %, greater than or about 17 at. %, greater than or about 18 at. %, greater than or about 19 at. %, greater than or about 20 at. %, greater than or about 21 at. %, greater than or about 22 at. %, greater than or about 23 at. %, greater than or about 24 at. %, greater than or about 25 at. %, or more. During operation 310, carbon may be removed at a quicker rate relative to other elements in the silicon-containing material of the spacer 435, such as silicon, oxygen, and other elements. Carbon may outgas during the etching of the silicon-containing material of the spacer 435. After operation 310, the silicon-containing material of the spacer 435 may be characterized by a carbon concentration of less than or about 15 at. %, such as less than or about 14 at. %, less than or about 13 at. %, less than or about 12 at. %, less than or about 11 at. %, less than or about 10 at. %, or less.

Conversely, an oxygen concentration in the silicon-containing material of the spacer 435 may increase during operation 310, which may be due to the interaction between the one or more etchant precursors, such as oxygen-containing precursors, and the silicon-containing material of the spacer 435.

At operation 315, method 300 may include providing a carbon-containing precursor to the processing region of the semiconductor processing chamber. The carbon-containing precursor may be any precursor including carbon and may also include silicon and/or oxygen. In embodiments, the carbon-containing precursor may be or include hexamethyldisilazane (HMDS), tetramethyldisilazane (TMDS), trimethylchlorosilane (TMCS), dimethyldichlorosilane (DMDCS), methyltrichlorosilane (MTCS), trimethylmethoxysilane (TMMS)($CH_3$—O—Si—$(CH_3)_3$), dimethyldimethoxysilane (DMDMS)($(CH_3)_2$—Si—$(OCH_3)_2$), methyltrimethoxysilane (MTMS)($(CH_3$—$O)_3$—Si—$CH_3$), phenyltrimethoxysilane (PTMOS)($C_6H_5$—Si—$(OCH_3)_3$), phenyldimethylchlorosilane (PDMCS) ($C_6H_5$—Si(Cl)—$(CH_3)_2$), dimethylaminotrimethylsilane (DMATMS) ($(CH_3)_2$—N—Si—$(CH_3)_3$), or bis(dimethylamino)dimethylsilane (BDMADMS), as well as any other carbon-containing precursor that may be used in semiconductor processing. The precursors may or may not include delivery of additional precursors, such as one or more carrier gases to assist the flow of the carbon-containing precursor. The carrier gases may include helium, argon, or diatomic nitrogen.

In embodiments, method 300 may include generating a plasma of the carbon-containing precursor. The plasma effluents of the carbon-containing precursor may be generated at a plasma power of less than or about 3000 W, and may be generated at a plasma power of less than or about 2750 W, less than or about 2500 W, less than or about 2250 W, less than or about 2000 W, less than or about 1750 W, less than or about 1500 W, less than or about 1250 W, less than or about 1000 W, less than or about 750 W, less than or about 500 W, less than or about 250 W, or less. While a plasma of the carbon-containing precursor may be generated in some embodiments, other embodiments may include a thermal process that does not include generating a plasma of the carbon-containing precursor.

At operation 320, method 300 may include contacting a remaining silicon-containing material of the spacer 435 with the carbon-containing precursor or the plasma effluents thereof. Contacting remaining silicon-containing material of the spacer 435 with the carbon-containing precursor may introduce carbon to the silicon-containing material of the spacer 435. The introduction of carbon and contacting at operation 320 may replace carbon that was depleted during etching of the silicon-containing material of the liner at operation 310. The carbon-containing compound may be provided in vapor phase, which may allow the carbon-containing precursor to penetrate deeply into the remaining silicon-containing material of the spacer 435. The vaporized carbon-containing precursor may be vaporized prior to being provided to the processing region at operation 315 or may be vaporized in the processing region.

Contacting the remaining silicon-containing material of the spacer 435 with the carbon-containing precursor or the plasma effluents thereof at operation 320 may increase the carbon concentration in the silicon-containing material of the spacer 435. The carbon concentration may be increased to the concentrations previously discussed, such as concentrations prior to operation 310. For example, after operation 320, the exposed surface of the silicon-containing material of the spacer 435 may be characterized by a carbon concentration of greater than or about 15 at. %, such as greater than or about 16 at. %, greater than or about 17 at. %, greater than or about 18 at. %, greater than or about 19 at. %, greater than or about 20 at. %, greater than or about 21 at. %, greater than or about 22 at. %, greater than or about 23 at. %, greater than or about 24 at. %, greater than or about 25 at. %, or more. In embodiments, contacting the remaining silicon-containing material of the spacer 435 with the carbon-containing precursor at operation 320 may increase the carbon concentration at the exposed surface of the remaining silicon-containing material of the spacer 435 by greater than or about 5 at. %, such as greater than or about 6 at. %, greater than or about 7 at. %, greater than or about 8 at. %, greater than or about 9 at. %, greater than or about 10 at. %, or more.

At optional operation 325, method 300 may include exposing the substrate to ultraviolet (UV) radiation. The UV radiation source may be, for example, a UV lamp. The UV radiation source may be positioned outside of the semiconductor processing chamber, and the semiconductor processing chamber may have a quartz window through which UV radiation may pass. The structure 400 may be positioned in an inert gas environment, such as, for example, helium, argon, or diatomic nitrogen. The processing semiconductor chamber may include a microwave source to heat the silicon-containing material of the spacer 435 prior to or concurrently with contacting the silicon-containing material with UV radiation. In embodiments, the UV radiation exposure may be conducted using a plasma to simulate UV radiation wavelengths. The plasma may be formed by coupling RF power to a treatment gas such as, for example, helium, argon, molecular oxygen, or diatomic oxygen. Exposing the silicon-containing material of the spacer 435 to UV radiation may break Si—H and/or SI—OH bonds in the material, allowing Si—$CH_2$—$CH_2$—$Si(CH_3)_3$ and/or Si—O—$Si(CH_3)_3$ bonds to form, thereby increasing the carbon concentration.

During operation 325, conditions of the UV radiation may be tailored to treat the silicon-containing material of the spacer 435. For example, a UV irradiance power may be characterized by between about 100 $W/m^2$ and about 2000 $W/m^2$. At UV irradiance powers less than 100 $W/m^2$, the UV radiation may not be significant enough to modify the material. At UV irradiance powers greater than 2000 $W/m^2$, the UV radiation may damage the material or structure. Additionally, a UV wavelength may be characterized by between about 100 nm and about 400 nm. A UV wavelength below 100 nm may require a special light source that may not be commonly available. A UV wavelength above 400 nm, such as visible light, may not have sufficient energy to modify the previously discussed bonds.

In embodiments, contacting the remaining silicon-containing material of the spacer 435 with the carbon-containing precursor and exposing the substrate to ultraviolet (UV) radiation may be performed simultaneously. Specifically, operations 320 and 325 may be performed simultaneously to treat the remaining silicon-containing material of the spacer 435. However, it is still contemplated that the operations may be performed in sequence in some embodiments.

At operation 330, method 300 may include providing a cleaning agent to the processing region of the semiconductor processing chamber. The cleaning agent may be any wet etchant and may be, for example, a fluorine-containing cleaning agent. In embodiments, the fluorine-containing cleaning agent may be or include dilute hydrofluoric acid. At operation 335, contacting the substrate 405 with the cleaning agent. The cleaning agent may be provided to clean the structure 400 after trimming the spacer 435 or may be provided to clean the structure 400 after removing the dummy gate 425.

Process conditions may impact the operations performed in method 300. Each of the operations of method 300 may be performed during a constant temperature in embodiments, while in some embodiments the temperature may be adjusted during different operations. In some embodiments of the present technology, method 300 may be performed at substrate, pedestal, and/or chamber temperatures less or about 500° C., which may be due to thermal budget issues, and may be performed at temperatures less than or about 475° C., less than or about 450° C., less than or about 425° C., less than or about 400° C., less than or about 375° C., less or about 350° C., less or about 325° C., less or about 300° C., less or about 275° C., less or about 250° C., or lower. The temperature may also be maintained at any temperature within these ranges, within smaller ranges encompassed by these ranges, or between any of these ranges. Forming material at increased temperatures may increase the amount of carbon introduced into the silicon-containing material of the spacer 435 at operation 320 and, therefore, improve resistant to wet etchants. Accordingly, in some embodiments, the temperature may be maintained between at greater than or about 200° C., and may be maintained at greater than or about 225° C., greater than or about 250° C., greater than or about 275° C., greater than or about 300° C., greater than or about 325° C., greater than or about 350° C., or higher.

The pressure within the semiconductor processing chamber may also affect the operations performed. In embodiments, the pressure may be maintained at less than about 40 Torr. Accordingly, the pressure may be maintained at less than or about 35 Torr, less than or about 30 Torr, less than or about 25 Torr, less than or about 20 Torr, less than or about 18 Torr, less than or about 16 Torr, less than or about 14 Torr, less than or about 12 Torr, less than or about 10 Torr, less than or about 8 Torr, less than or about 6 Torr, less than or about 4 Torr, less than or about 2 Torr, less than or about 1 Torr, or less. The pressure may also be maintained at any pressure within these ranges, within smaller ranges encompassed by these ranges, or between any of these ranges.

In conventional embodiments, the remaining silicon-containing material of the spacer 435, with reduced carbon concentration at the exposed surface of the silicon-containing material, may have poor resistance to the cleaning agent at operation 330. In these conventional embodiments, the spacer 435 may be removed entirely, which may damage or destroy the structure 400. By treating the silicon-containing material of the spacer 435 with the carbon-containing precursor and/or exposing the silicon-containing material of the spacer to UV radiation, carbon may be replenished to the silicon-containing material. The increased carbon concentration may increase the resistance of the silicon-containing material of the spacer 435 to cleaning agents and other wet etchants used in processing. Conventional embodiments may immediately begin etching the silicon-containing material of the spacer 435 when exposed to cleaning agents and other wet etchants whereas the present technology may resist any etching for greater than or about 5 seconds of exposure, such as greater than 10 seconds of exposure, greater than or about 15 seconds of exposure, greater than 20 seconds of exposure, greater than or about 25 seconds of exposure, greater than 30 seconds of exposure, greater than or about 35 seconds of exposure, greater than 40 seconds of exposure, or more.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursor, and reference to "the material" includes reference to one or more materials and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:

etching a portion of a silicon-containing material from a substrate disposed within a processing region of a semiconductor processing chamber, wherein the silicon-containing material extends into one or more recesses defined by alternating layers of material deposited on the substrate;

subsequent to etching the portion of the silicon-containing material, performing a carbon replenishment, wherein the carbon replenishment comprises:

providing a carbon-containing precursor to the processing region of the semiconductor processing chamber; and contacting a remaining silicon-containing material with the carbon-containing precursor, wherein the contacting with the carbon-containing precursor replenishes carbon in the silicon-containing material; and subsequent to performing a carbon replenishment, performing a cleaning, wherein the cleaning comprises:

providing a cleaning agent to the processing region of the semiconductor processing chamber; and contacting the substrate with the cleaning agent, wherein the contacting with the cleaning agent removes surface oxide from the substrate.

2. The semiconductor processing method of claim 1, wherein the silicon-containing material comprises a silicon-and-oxygen-containing material.

3. The semiconductor processing method of claim 1, wherein the silicon-containing material comprises a silicon-oxygen-and-carbon-containing material.

4. The semiconductor processing method of claim 1, further comprising:

generating a plasma of the carbon-containing precursor, wherein the contacting of the remaining silicon-containing material with the carbon-containing precursor comprises contacting the remaining silicon-containing material with plasma effluents of the carbon-containing precursor.

5. The semiconductor processing method of claim 4, wherein a plasma power is less than or about 3000 W.

6. The semiconductor processing method of claim 1, wherein the carbon-containing precursor comprises hexamethyldisilazane (HMDS), tetramethyldisilazane (TMDS), trimethylchlorosilane (TMCS), dimethyldichlorosilane (DMDCS), methyltrichlorosilane (MTCS), trimethylmethoxysilane (TMMS) ($CH_3$—O—Si—$(CH_3)_3$), dimethyldimethoxysilane (DMDMS) ($(CH_3)_2$—Si—$(OCH_3)_2$), methyltrimethoxysilane (MTMS) ($(CH_3$—$O)_3$—Si—$CH_3$), phenyltrimethoxysilane (PTMOS) ($C_6H_5$—Si—$(OCH_3)_3$), phenyldimethylchlorosilane (PDMCS) ($C_6H_5$—Si(Cl)—$(CH_3)_2$), dimethylaminotrimethylsilane (DMATMS) ($(CH_3)_2$—N—Si—$(CH_3)_3$), or bis(dimethylamino)dimethylsilane (BDMADMS).

7. The semiconductor processing method of claim 1, further comprising:

exposing the substrate to ultraviolet (UV) radiation prior to providing the cleaning agent to the processing region of the semiconductor processing chamber.

8. The semiconductor processing method of claim 7, wherein contacting the remaining silicon-containing material with the carbon-containing precursor and exposing the substrate to ultraviolet (UV) radiation are performed simultaneously.

9. The semiconductor processing method of claim 7, wherein:

a UV irradiance power is characterized by between about 100 $W/m^2$ and about 2000 $W/m^2$; and a UV wavelength is characterized by between about 100 nm and about 400 nm.

10. The semiconductor processing method of claim 1, wherein a temperature in the semiconductor processing chamber is less than or about 500° C.

11. A semiconductor processing method comprising:

i) providing a carbon-containing precursor to a processing region of a semiconductor processing chamber, wherein a substrate is disposed within the processing region, wherein a silicon-containing material extends into one or more recesses defined by alternating layers of material deposited on the substrate, and wherein an exposed surface of the silicon-containing material is characterized by a first carbon concentration;

ii) contacting the silicon-containing material with the carbon-containing precursor, wherein the contacting increases the first carbon concentration to a second carbon concentration;

iii) providing a cleaning agent to the processing region of the semiconductor processing chamber; and iv) contacting the substrate with the cleaning agent, wherein the cleaning agent removes surface oxide from the substrate.

12. The semiconductor processing method of claim 11, further comprising:

providing one or more etchant precursors to the processing region of the semiconductor processing chamber;

contacting the substrate with the one or more etchant precursors; and etching a portion of the silicon-containing material from the substrate.

13. The semiconductor processing method of claim 11, wherein the cleaning agent comprises dilute hydrofluoric acid.

14. The semiconductor processing method of claim 11, wherein the second carbon concentration is greater than or about 5 at. % higher than the first carbon concentration.

15. The semiconductor processing method of claim 11, wherein the silicon-containing material comprises an inner spacer of a gate all around structure.

16. The semiconductor processing method of claim 11, further comprising:

exposing the substrate to ultraviolet (UV) radiation.

17. A semiconductor processing method comprising:

i) providing a carbon-containing precursor to a processing region of a semiconductor processing chamber, wherein a substrate is disposed within the processing region, wherein a silicon-containing material extends into one or more recesses defined by alternating layers of material deposited on the substrate, and wherein an exposed surface of the silicon-containing material is characterized by a first carbon concentration;

ii) contacting the silicon-containing material with the carbon-containing precursor, wherein the contacting increases the first carbon concentration to a second carbon concentration greater than or about 5 at. % higher than the first carbon concentration;

iii) exposing the substrate to ultraviolet (UV) radiation;

iv) providing a cleaning agent to the processing region of the semiconductor processing chamber; and v) contacting the substrate with the cleaning agent, wherein the cleaning agent removes surface oxide from the substrate.

18. The semiconductor processing method of claim 17, wherein contacting the silicon-containing material with the carbon-containing precursor and exposing the substrate to ultraviolet (UV) radiation are performed simultaneously.

19. The semiconductor processing method of claim 17, wherein the second carbon concentration is greater than or about 20 at. %.

20. The semiconductor processing method of claim 17, wherein a temperature in the semiconductor processing chamber is greater than or about 200° C.

* * * * *